(12) United States Patent
Singh et al.

(10) Patent No.: US 10,353,447 B2
(45) Date of Patent: Jul. 16, 2019

(54) CURRENT IN-RUSH MITIGATION FOR POWER-UP OF EMBEDDED MEMORIES

(71) Applicant: QUALCOMM Incorporated, San Diego, CA (US)

(72) Inventors: Harmander Singh, Cedar Park, TX (US); Sebastien Weyland, Austin, TX (US); Suresh Kumar Venkumahanti, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 251 days.

(21) Appl. No.: 15/449,836

(22) Filed: Mar. 3, 2017

(65) Prior Publication Data

US 2018/0253129 A1   Sep. 6, 2018

(51) Int. Cl.
| | |
|---|---|
| *G06F 1/26* | (2006.01) |
| *G11C 5/14* | (2006.01) |
| *G11C 16/20* | (2006.01) |
| *G11C 16/30* | (2006.01) |
| *G11C 29/02* | (2006.01) |

(52) U.S. Cl.
CPC ............ *G06F 1/26* (2013.01); *G11C 5/148* (2013.01); *G11C 16/20* (2013.01); *G11C 16/30* (2013.01); *G11C 29/021* (2013.01); *G11C 29/028* (2013.01)

(58) Field of Classification Search
CPC ........ G06F 1/26; G06F 1/3275; G06F 1/3253; G06F 1/3287; G11C 16/30; G11C 5/145; G11C 5/148; G11C 8/12; H02H 9/002; H02H 9/004; H02H 9/001; H02J 2003/388; Y02D 10/171; Y10T 307/391
See application file for complete search history.

(56) References Cited

U.S. PATENT DOCUMENTS

| | | | | |
|---|---|---|---|---|
| 4,769,555 | A | * | 9/1988 | Pequet .................... G05F 1/577 307/112 |
| 5,959,930 | A | * | 9/1999 | Sakurai .................... G11C 8/12 365/230.03 |
| 6,020,770 | A | * | 2/2000 | Madsen ................... H03M 9/00 327/115 |
| 8,063,664 | B2 | | 11/2011 | Chua-Eoan et al. |
| 8,868,941 | B2 | | 10/2014 | Jayasimha et al. |
| 9,219,365 | B2 | * | 12/2015 | Ontiveros ................. H02J 3/14 |
| 9,310,863 | B2 | | 4/2016 | Karimian-Kakolaki et al. |
| 9,405,357 | B2 | | 8/2016 | Kosonocky et al. |
| 9,564,180 | B1 | * | 2/2017 | Pilo ......................... G11C 5/148 |
| 2002/0038412 | A1 | * | 3/2002 | Nizar ........................ G11C 7/20 711/170 |
| 2002/0140463 | A1 | * | 10/2002 | Cheung ................... G11C 5/145 327/100 |

(Continued)

*Primary Examiner* — Jaweed A Abbaszadeh
*Assistant Examiner* — Brian J Corcoran
(74) *Attorney, Agent, or Firm* — Haynes and Boone, LLP (36340)

(57) ABSTRACT

A programmable logic circuit such as a finite state machine is provided that is configured to determine a memory array power-up sequence from a configuration signal to successively enable each memory array. A delay circuit triggers an initial memory bank in each enabled memory array to power-up without a delay. The delay circuit then counts responsive to a clock to determine a delay between a successive triggering of remaining memory banks in each enabled memory array to power-up.

16 Claims, 3 Drawing Sheets

(56) References Cited

U.S. PATENT DOCUMENTS

| | | | |
|---|---|---|---|
| 2002/0167334 A1* | 11/2002 | Nakaizumi | G01R 31/31709 326/93 |
| 2003/0105984 A1* | 6/2003 | Masuyama | G06F 1/26 713/330 |
| 2004/0041547 A1* | 3/2004 | Asano | G06F 1/04 323/274 |
| 2007/0067599 A1* | 3/2007 | Neils | G06F 13/1694 711/170 |
| 2010/0268917 A1* | 10/2010 | Nation | G06F 1/3203 712/208 |
| 2010/0295590 A1* | 11/2010 | Yoshihara | G04F 10/005 327/265 |
| 2011/0260768 A1* | 10/2011 | Welguisz | H03H 11/265 327/286 |
| 2012/0185687 A1* | 7/2012 | Matsumura | G06F 1/3206 713/100 |
| 2014/0022685 A1* | 1/2014 | Miao | H02H 9/001 361/94 |
| 2014/0136873 A1* | 5/2014 | Breternitz | G06F 1/3275 713/340 |
| 2015/0370296 A1 | 12/2015 | Purcell et al. | |
| 2017/0076778 A1* | 3/2017 | Mochida | G11C 11/4091 |
| 2017/0270987 A1* | 9/2017 | Matsuoka | G11C 11/1675 |

* cited by examiner

CURRENT IN-RUSH MITIGATION FOR POWER-UP OF EMBEDDED MEMORIES

TECHNICAL FIELD

This application relates to systems with embedded memories, and more particularly to the mitigation of current in-rush during the power-up of systems with embedded memories.

BACKGROUND

Within an integrated circuit such as a system-on-a-chip (SoC), it is conventional to segregate subsystems into corresponding power domains. Each subsystem's power domain has its own power supply rail for supplying a power supply voltage to the subsystem's devices, including its embedded memories. Although the power supply rails are associated with bypass capacitors to assist in maintaining the power supply voltage, the sudden switching on of a plurality of embedded memories within a given power domain causes its power supply voltage to momentarily droop due to an in-rush of current into the switched-on embedded memories. If this droop is too pronounced, the power island resets and must boot up again.

To prevent such mishaps, it is thus conventional to sequence the power-up of the embedded memories to reduce the voltage droop to an acceptable level that ensures normal operation. For example, it is conventional to use timed bits that stage the turn-on of various memory banks within an array of memories. Alternatively, the various memory banks within an array may have their power sequencing through a daisy chain of buffers. In addition, the power sequencing may be determined through different sized switches or slew control. But such conventional in-rush mitigation requires the circuit designer to lock the sequencing of the memories and the delays from the buffer chains prior to the instantiation of the device. After tape-out, it may be discovered that process variations and other factors produce more in-rush current than expected despite the memory sequencing such that the voltage droop on the rail causes circuit operation errors. This is quite costly as the SoC must then be redesigned. The designer will thus tend to err on providing too much delay in the memory sequencing, which slows operation and consumes power.

Accordingly, there is a need in the art for improved current in-rush mitigation during power up sequencing of embedded memories.

SUMMARY

An integrated circuit is provided with a logic circuit such as a finite state machine that responds to a configuration signal to determine a memory array power-up sequence. For example, the configuration signal may be retrieved from a read-only memory such as used in the firmware for the integrated circuit. Alternatively, the configuration signal may be generated through software running on a processor within the integrated circuit. But regardless of how the configuration signal is generated, the resulting memory array power-up sequencing during power-up is dynamic in that it may be altered by merely altering the configuration signal. The resulting flexibility with regard to configuring the memory array power-up sequence is quite advantageous in that a designer need not lock in a memory array power-up sequencing until after the integrated circuit design is manufactured. In this fashion, the memory power-up sequencing may be adjusted if necessary to optimize the power-up sequencing time without causing any undesirable power supply voltage droops on a power supply voltage for the sequenced memory arrays.

Each memory array includes a plurality of memory banks. To prevent excessive in-rush current during the power-up sequencing, the memory banks are also successively triggered to power-up according to a memory bank power-up sequence by a delay circuit. When a given memory array is enabled according to the memory array power-up sequence, the delay circuit may immediately trigger an initial one of the memory banks in the enabled memory array to power-up since there is no current being drawn by any other power-up of a memory bank at that time. The delay circuit then sequences the power up of successive ones of the remaining memory banks according to the memory bank power-up sequence such that the successive power-ups of the remaining memory banks are spaced apart by a delay calculated by the delay circuit responsive to a clock signal. The memory bank power-up sequence may be fixed or it may be programmable such that the programmable logic circuit would also determine the memory bank power-up sequence responsive to the configuration signal. The resulting delay circuit is advantageously compact as compared to the conventional use of a series of buffers to determine the memory bank power-up sequence.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

To provide improved current in-rush mitigation, a power-on sequencing circuit is disclosed that controls the power-on sequencing of embedded memories. For example, each embedded memory may be a memory array that includes a plurality of memory banks. The power-on sequencing in such embodiments not only controls the sequencing of memory arrays during power-up but also the sequencing of the memory banks. The power-on sequencing is at least partially configurable responsive to a configuration signal. In particular, note that the memory banks within each of the memory arrays are typically quite homogeneous. A configurable memory bank power-on sequence for sequencing the power-up of the memory banks in a currently-powering-on one of the memory arrays would thus be unnecessary in such homogenous embodiments. However, there may be memory arrays in which the memory banks are not sufficiently homogeneous. Advantageously, the power-on sequencing circuit disclosed herein is readily adapted to provide whatever degree of flexibility is desired with regard to the power-on sequencing of not only the memory arrays but also the memory banks.

Figure 1:
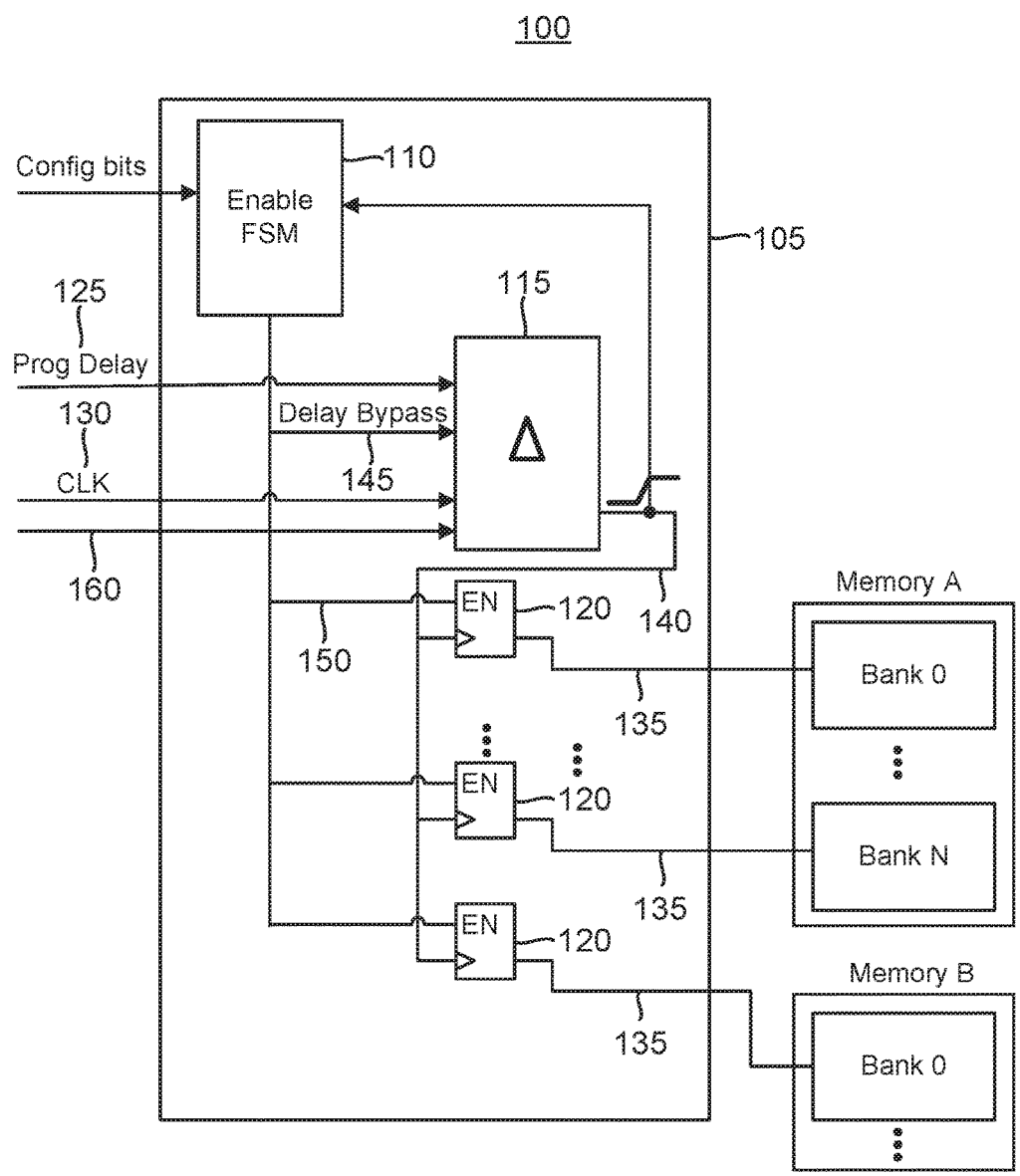
FIG. 1 is a diagram of an integrated circuit including a plurality of memory arrays having memory banks that are sequenced during power-up according to a programmable power-up sequence determined by a finite state machine in accordance with an aspect of the disclosure.

An example power-on sequencing circuit 105 for a power domain 100 for an integrated circuit is shown in FIG. 1 to control the power-on sequencing of a plurality of memory arrays. For illustration clarity, only a memory array A and a memory array B are shown in FIG. 1 but it will be appreciated that any number of memory arrays may be sequenced during power-on by power-on sequencing circuit 100. To provide a flexibility with regard to the memory array power-on sequencing, power-on sequencing circuit 100 includes a logic circuit such as a finite state machine 110 that is configured to decode one or more configuration bits (Config bits) to determine a memory array power-on sequence. This memory array power-on sequence may be for just a subset of the memory arrays within power domain 100. Alternatively, the memory array power-on sequence may determine the power-on sequencing of all the memory arrays in power domain 100.

Each memory array includes a plurality of N+1 memory banks ranging from a bank 0 to a bank N, where N is a positive integer. Note that when a given memory array (for example, memory array A) is enabled for power on by the FSM 110, it would cause too great of an in-rush of current to simply power on all the memory banks at once. FSM 110 may thus also be configured to determine a memory bank power-on sequence from the configuration bits. But as discussed above, such a programmability of the memory bank power-on sequence may be superfluous in embodiments in which the memory banks are substantially homogeneous within each of the memory arrays. Accordingly, the following discussion will be directed to embodiments in which the memory bank power-on sequencing is fixed. FSM 110 would still be configured with this fixed order, it simply would not be programmable. Regardless of whether the memory bank power-on sequencing is fixed or programmable, FSM 110 is configured to individually enable each memory array according to the memory array power-on sequencing. For an enabled memory array, FSM 110 also enables each of its memory banks according to the memory bank power-on sequence. If the memory bank power-on sequence is fixed, it will of course be the same for each memory array. But it will be appreciated that FSM 110 may be readily configured to determine an individual memory bank power-on sequence for each enabled memory array.

With regard to the memory array power-on sequence determined by FSM 110, there will be an initial memory array followed by a second memory array, and so on. Starting with the initial memory array, there will be an initial memory bank in that initial memory array that is enabled by FSM 110 to power-on first. This initial memory bank is followed by successive memory banks in the enabled memory array according to the memory bank power-on sequence. Although FSM 110 enables the power-on sequencing across the memory arrays and across the memory banks, the actual triggering of each memory bank is controlled by a delay circuit 115. Delay circuit 115 determines a delay that separates in time the successive power on of memory banks in the enabled memory array. For example, delay circuit 115 may be configured to counting edges (rising or falling) of a clock signal (CLK) 130 to determine the delay. This counting may be controlled by a programmable delay configuration signal (Prog Delay) 125 such that the delay is a programmable delay.

With regard to the counting of clock edges, in one embodiment programmable delay configuration signal 125 controls the number of successive clock edges counted by delay circuit 115 to determine the programmable delay. For example, delay circuit 115 may count two successive clock edges (either rising or falling) of clock signal 130 such that the programmable delay equals the clock signal period. For another value of programmable delay configuration signal 125, delay circuit may respond by counting four successive clock edges such that the programmable delay equals twice the clock signal period. Should the clock signal frequency be 500 MHz, the programmable delay could thus be 2 ns, 4 ns, 6 ns, and so on. In this fashion, the programmable delay may be tuned to achieve the minimal delay necessary to prevent excessive sag of the power supply voltage from in-rush currents during the power-on sequencing in power domain 100 so as to advantageously minimize the latency for the power-on sequencing of the embedded memories.

To combine the enabling of the power-on sequence across the memory arrays (and also across the memory banks) with the delay from delay circuit 115, each memory bank may be associated with its own register 120. FSM 110 generates an individual enable signal (EN) that is used to set a data input for each register 120 according to the power-on sequence. When delay circuit 115 asserts an output signal 140 to trigger a clock input for a given register 120 having an asserted data input, an output 135 for the given register 120 is asserted to trigger the power-on of the corresponding memory bank. For example, suppose that memory array A is the initial memory array in the power-on sequence determined by FSM 110. This power-on sequence not only determines the memory array power-on sequence but also the memory bank power-on sequence. The power-on sequence will start by the enablement of an initial memory bank in memory array A (for example, memory bank 0). Note that there needs to be no delay for such an initial memory bank such that FSM 110 triggers delay circuit 110 with a delay bypass signal 145. Delay circuit 115 responds to the assertion of delay bypass signal 145 by immediately asserting its output signal 140. Register 120 for memory bank 0 in memory array A will thus register an individual asserted enable signal 150 from FSM 110 responsive to the triggering of its clock input by output signal 140 from delay circuit 115. Register 120 for corresponding memory bank 0 in memory array A will thus trigger memory bank 0 to power on. FSM 110 receives output signal 140 so that FSM 110 may then assert the enable signal for the successive memory bank responsive to the power-on sequence. But for each successive memory bank in memory array A, delay circuit 115 will only assert its output signal 140 after the programmable delay has expired from the triggering of the preceding memory bank. In this fashion, the triggering of the successive memory banks remaining in memory array A will not cause excessive in-rush currents to jeopardize the power supply voltage for power domain 100. Once all memory banks have been triggered in memory array A, FSM 110 will enable an initial memory bank in another memory bank (e.g., memory bank 0 in memory bank B, whereupon the power-on sequencing for memory array B continues according to the power-on sequence. Power-on sequencing circuit 105 may be reset (such as responsive to a power-on reset sequence) by a reset signal 160.

It may thus be appreciated that with regard to the power-on sequencing across all the memory banks in all the memory arrays, FSM 105 enables each memory array according a memory array power-on sequence. This memory power-on sequence may be either fully or partially programmable. Similarly, for each enabled memory array, FSM 105 successively enables the enable memory array's memory banks according to a memory bank power-on sequence, which may be fixed, partially programmable, or fully programmable. The resulting power-on sequencing is quite advantageous in that a designer of power domain 100 need not be constrained to any particular memory array power on sequence. Moreover, delay circuit 115 avoids the use of buffer chains and their resulting loss of density with regard to occupying space on the die.

In one embodiment, power-on sequencing circuit 105 may be deemed to form a means for successively enabling each memory array according to a programmable memory array power-up sequence and for successively triggering each memory bank in each enabled memory array to power-up according to a memory bank power-up sequence.

Figure 2:
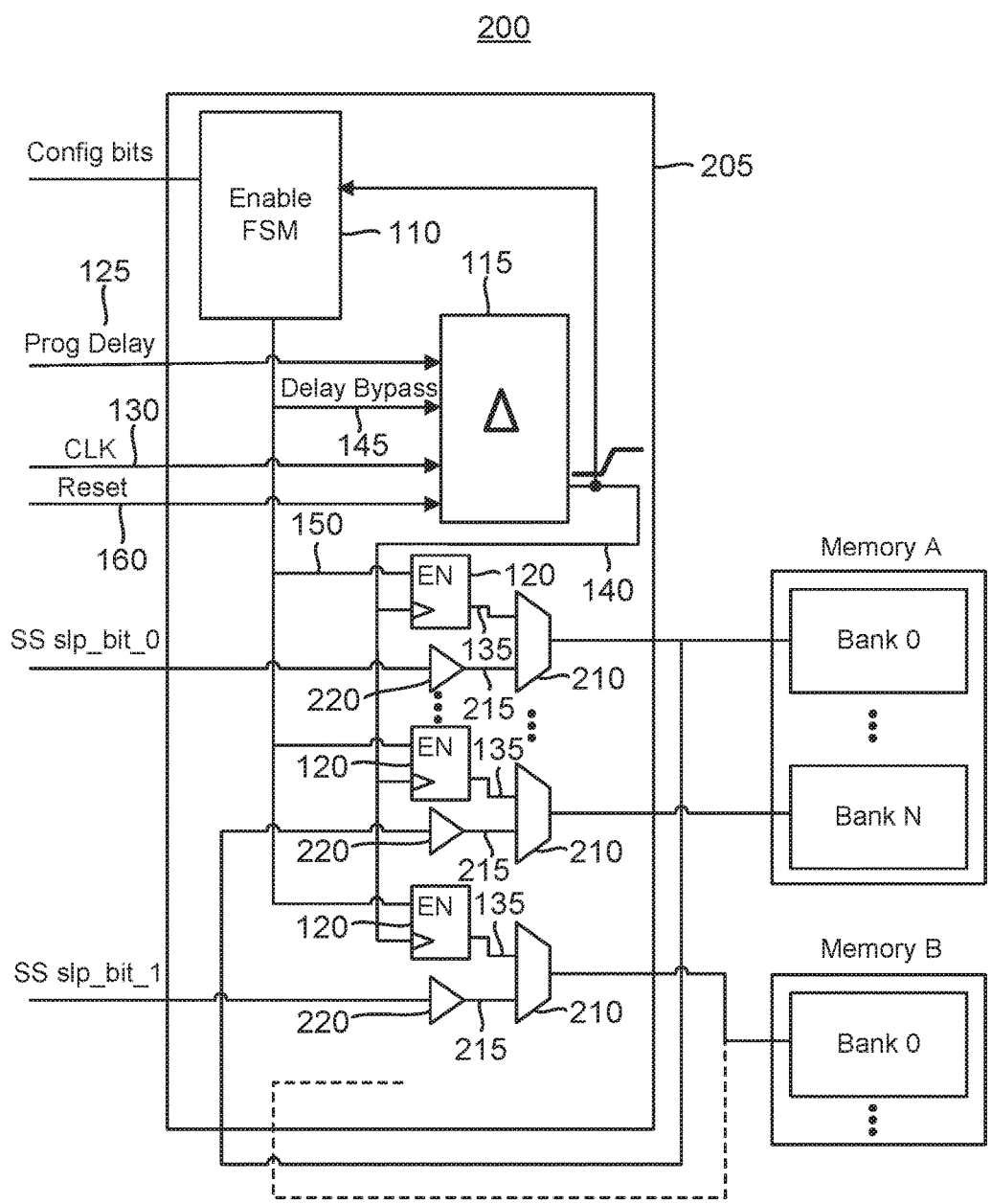
FIG. 2 is a diagram of a power domain including a power-on sequencing circuit modified so as to be compatible with a conventional use of timed bits to control the power-up sequence in accordance with an aspect of the disclosure.

Although power-on sequencing circuit 105 is quite advantageous, a user may desire compatibility with legacy power-on techniques such as the use of timed-bits. Power-on sequencing circuit 105 may thus be modified to also allow the use of timing bits such as in a power-on sequencing circuit 205 shown in FIG. 2 for a power domain 200. FSM 110, delay circuit 115, and registers 120 operate as discussed with regard to FIG. 1. However, each memory bank associates with a corresponding multiplexer 210 that selects between output signal 135 from the memory bank's corresponding register 120 and a buffer output signal 215 from a corresponding buffer 220. Multiplexers 210 respond to a mode signal that selects between a legacy power-on sequencing mode and a programmable power-on sequencing mode. Each memory array associates with its own timing bit for the legacy power-on sequencing mode. For example, a timing bit SS slp_bit_0 controls the legacy power-on sequencing for memory array A whereas a timing bit SS slp_bit_1 controls the legacy power-on sequencing for memory array A. Buffers 220 for each memory array are arranged in a buffer chain as discussed previously with regard to the prior art. In the legacy power-on sequencing mode, multiplexers 210 are controlled to select for the corresponding buffer output signal 215. Should multiplexers 210 instead be controlled to select for output signals 135, the programmable power-on sequencing discussed with regard to FIG. 1 will be effected.

Figure 3:
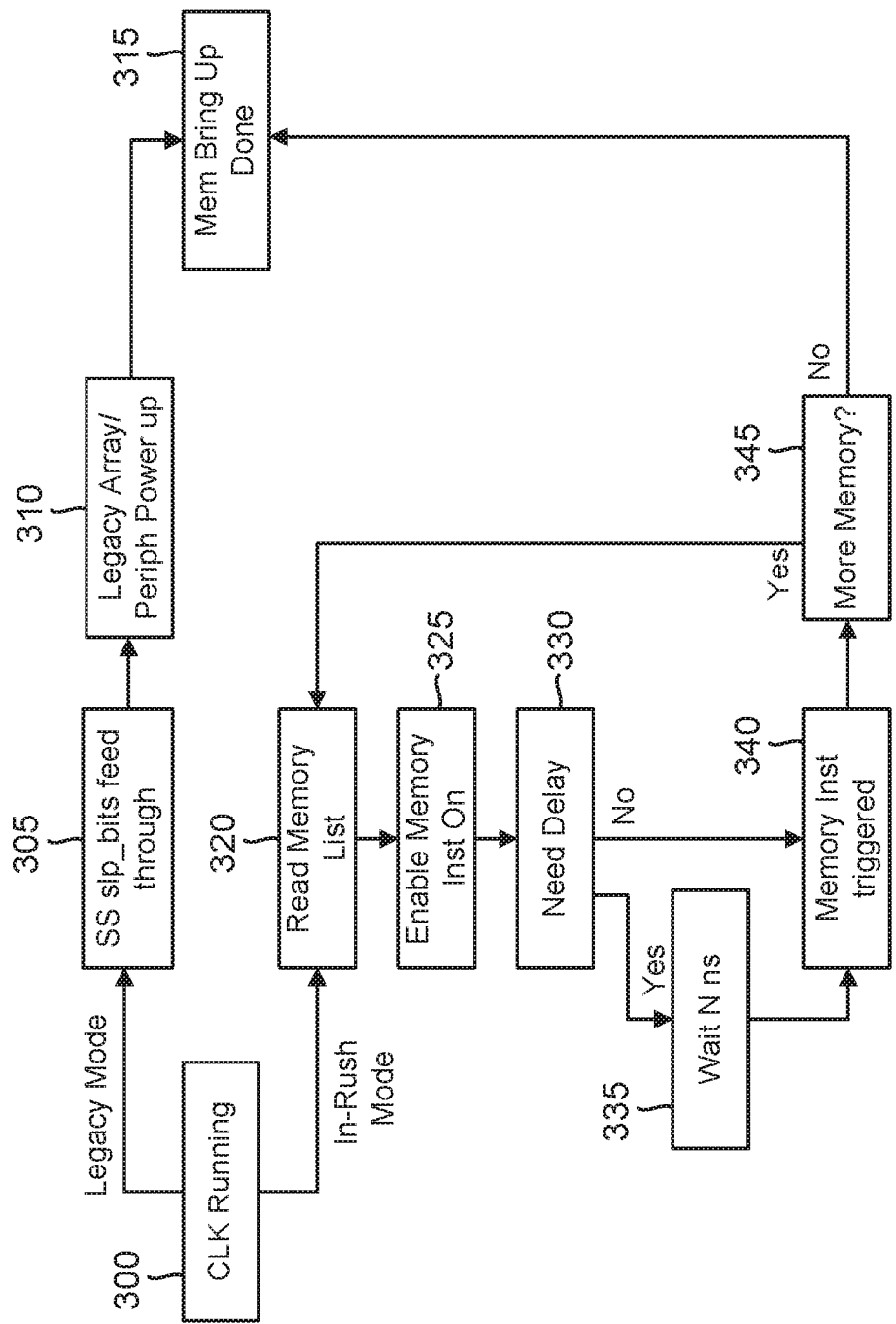
FIG. 3 is a flowchart for an example method of operation for the power-on sequencing circuit of FIG. 2.

A method of operation for power domain 200 is summarized with regard to the flowchart shown in FIG. 3. The method begins with the cycling of clock signal 130 in an act 300. Should the legacy power-on sequencing mode be enabled, the timing bits are applied in an act 305 so that the legacy power-on sequencing of the memory banks across the various memory arrays may occur in an act 310, whereupon the memory array power-on sequencing is completed in an act 315.

Should the programmable power-on sequencing mode be enabled instead of the legacy mode, FSM 110 reads its power-on sequence (such as stored in a list) in an act 320 to enable a current one of the memory banks in an act 325. As discussed with regard to FIG. 1, an initial memory bank in an enabled memory array needs no delay to be powered up whereas remaining memory banks in the enabled memory array besides the initial memory bank due require delay between powering on of successive ones of the remaining memory banks. Accordingly, the programmable power-on sequencing mode includes an act 330 of determining whether the enabled memory bank requires delay. Should the determination be positive, delay circuit 115 counts the desired programmable delay in an act 335 such as by waiting for a certain number of nano-seconds. After the delay (or no delay if the determination in act 330 is negative), the programmable power-on sequencing mode continues with an act 340 of triggering the power-on of the enabled memory bank. Should a determination 345 indicate that no more memory banks remain to be powered on, the process ends in act 315. Otherwise, the process continues with act 320.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. An integrated circuit, comprising:
a plurality of memory arrays, each memory array including a plurality of memory banks, wherein each memory bank associates with a corresponding register;
a logic circuit configured to decode a memory configuration signal to determine a memory array power-up sequence for at least a subset of the memory arrays, wherein the logic circuit is further configured to successively enable the memory arrays in the subset according to the memory array power-up sequence; and
a delay circuit configured to successively trigger each memory bank in an enabled one of the memory arrays such that the memory banks in the enabled memory array power-on according to a memory bank power-on sequence, wherein the delay circuit is configured to set a clock input for each memory bank's corresponding register to successively trigger each memory bank.

2. The integrated circuit of claim 1, wherein the delay circuit is further configured to trigger an initial memory bank in the enabled memory array without a delay and to successively trigger a remainder of the memory banks in the enabled memory array such that a delay separates successive ones of the memory banks triggered according to the memory bank power-on sequence.

3. The integrated circuit of claim 2, wherein the delay is a programmable delay configured in the delay circuit responsive to a delay configuration signal.

4. The integrated circuit of claim 2, wherein the delay circuit is configured to determine the delay responsive to cycles of a clock signal.

5. The integrated circuit of claim 1, wherein the logic circuit comprises a finite state machine, and wherein the memory configuration signal comprises a plurality of configuration bits.

6. The integrated circuit of claim 1, wherein the subset of the memory arrays equals the plurality of memory arrays such that the memory array power-up sequence defines a power-up sequence for all the memory arrays in the plurality of memory arrays.

7. The integrated circuit of claim 1, wherein the subset of the memory arrays does not include all the memory arrays in the plurality of memory arrays.

8. The integrated circuit of claim 4, wherein the delay is a programmable delay, and wherein the delay circuit is configured to determine the programmable delay responsive to a count of selected edges in the clock signal.

9. The integrated circuit of claim 8, wherein the programmable delay equals a period of the clock signal.

10. The integrated circuit of claim 8, wherein the programmable delay equals a plurality of periods of the clock signal.

11. The integrated circuit of claim 8, wherein the programmable delay equals one half of a period for the clock signal.

12. A method, comprising:
responsive to a first configuration signal, determining a memory array power-up sequence for a plurality of memory arrays in an integrated circuit;
successively enabling each memory array according to the memory array power-up sequence, wherein each memory array includes an initial memory bank and a plurality of remaining memory banks, wherein each memory array further includes a plurality of registers corresponding to the plurality of remaining memory banks;
clocking an initial register corresponding to the initial memory bank to trigger the initial memory bank in an enabled one of the memory arrays to power up; and
following the triggering of the initial memory bank, successively triggering each remaining memory bank in the enabled memory array responsive to clocking the remaining memory bank's corresponding register to power-up each remaining memory array according to a memory bank power-up sequence.

13. The method of claim 12, wherein the successive triggering of each remaining memory bank occurs after a delay.

14. The method of claim 13, wherein the delay is a programmable delay, the method further comprising determining the programmable delay responsive to a second configuration signal.

15. The method of claim 13, further comprising determining the memory bank power-up sequence responsive to the first configuration signal.

16. The method of claim 13, further comprising counting successive edges of a clock signal to determine the delay.

* * * * *